US006255903B1

United States Patent
Leffel

(10) Patent No.: US 6,255,903 B1
(45) Date of Patent: Jul. 3, 2001

(54) LINEAR POWER AMPLIFIER WITH CONFIGURABLE FEEDFORWARD ERROR CORRECTION CIRCUITS

(75) Inventor: Michael David Leffel, Crystal Lake, IL (US)

(73) Assignee: Motorola, Schaumburg, IL (US)

( * ) Notice: Subject to any disclaimer, the term of this patent is extended or adjusted under 35 U.S.C. 154(b) by 0 days.

(21) Appl. No.: 09/455,040

(22) Filed: Dec. 6, 1999

(51) Int. Cl.⁷ .................................................. H03F 1/26
(52) U.S. Cl. ................................................. 330/51; 330/151
(58) Field of Search ............................... 330/51, 124 D, 330/124 R, 151

(56) References Cited

U.S. PATENT DOCUMENTS

| 5,065,110 | * | 11/1991 | Ludvik et al. | 330/151 X |
| 5,307,022 | | 4/1994 | Tattersall, Jr. et al. | 330/52 |
| 5,831,479 | | 11/1998 | Leffel et al. | 330/124 D |
| 6,057,733 | * | 5/2000 | Donaldson et al. | 330/151 |
| 6,069,527 | * | 5/2000 | Maruyama | 330/51 |

* cited by examiner

Primary Examiner—Steven J. Mottola
(74) Attorney, Agent, or Firm—Lalita P. Williams

(57) ABSTRACT

A linear power amplifier having one or more feedforward correction loops automatically reconfigures itself for single loop operation based on a power reduction condition. The power reduction condition may be a function of the input power of the linear power amplifier, a current draw of stages within the linear power amplifier, power consumption levels of feedforward error correction amplifiers, the time of day, or any other suitable condition. The linear power amplifier includes a main amplifier circuit (12) and at least a first feedforward error correction circuit (14). A control circuit (16) removes or reduces power from the power amplifier (26) in the main amplifier circuit (12) and reconfigures the feedforward error correction circuit (14) to serve as a temporary main amplifier circuit. This may be done, for example, at predetermined points where the linear power amplifier does not require the feedforward error correction circuit to obtain a desired level of linearity.

30 Claims, 4 Drawing Sheets

LINEAR POWER AMPLIFIER WITH CONFIGURABLE FEEDFORWARD ERROR CORRECTION CIRCUITS

FIELD OF THE INVENTION

The invention relates generally to linear power amplifiers and more particularly to linear power amplifiers having feedforward error correction.

BACKGROUND OF THE INVENTION

Extended linear power amplifier systems are often used in radio frequency communication systems, such as multicarrier cellular systems or other wireless communication systems. Extended linear power amplifier systems typically include a number of cascaded linear power amplifiers that output signals that are combined, as known in the art, into a single high power signal before transmission. The number of linear power amplifiers may be any suitable number and may be selectively shut down to adjust power consumption output by a transmission unit, for example, a cellular base station.

Such linear power amplifiers may employ feedforward error correction circuits for a group of cascaded linear power amplifiers, such as dual loop feedforward error correction circuits. Accordingly, improved linearity may be achieved with such linear power amplifiers. Accordingly, the main amplifiers of a linear power amplifier may be coupled to one, two or more feedforward error correction loops. The main amplifier circuit may include a plurality of cascaded power amplifiers that are coupled in a parallel fashion. The main amplifier circuits are typically larger and draw more current than the associated feed loops.

Although improved linearity may be provided by, for example, two feedforward loops coupled to a main amplifier circuit, each loop adds some amount of loss. One example of the operation of a feedforward amplifier may be found, for example, in U.S. Pat. No. 5,831,479, having inventor Leffel et al., issued Nov. 3, 1998, owned by instant assignee and incorporated herein by reference. Although conventional linear power amplifier systems may selectively turn off linear power amplifier stages, additional power savings may be desirable. In addition, a linear power amplifier having feedforward error correction may achieve its linearity to a suitable level without the requirement of one or more feedforward loops.

Accordingly, the linear power amplifiers may operate at different operating points depending upon received signal. It would be desirable to provide a linear power amplifier that is able to switch between different operating modes to offer power savings advantages at different operating points. Different operating modes include for example, enabling or disabling one or more feedforward loops; converting feedforward error amplifier circuits to temporary main amplifier circuits; or enabling or disabling all or parts of the main amplifier circuit.

Consequently, there exists a need for a linear power amplifier that provides improved efficiency in linear power amplifiers employing feedforward error correction circuits.

DETAILED DESCRIPTION OF THE PREFERRED EMBODIMENT

Briefly, a linear power amplifier having one or more feedforward correction loops automatically reconfigures itself for single loop or no loop operation based on a power reduction condition. The power reduction condition may be a function of the input power of the linear power amplifier, a current draw of stages within the linear power amplifier, power consumption levels of feedforward error correction amplifiers, the time of day, or any other suitable condition. The linear power amplifier includes a main amplifier circuit and at least a first error correction circuit. A control circuit removes or reduces power from the power amplifier in the main amplifier circuit and reconfigures the feedforward error correction circuit to serve as a temporary main amplifier circuit. This may be done, for example, at predetermined points where the linear power amplifier does not require the feedforward error correction circuit to obtain a desired level of linearity. Accordingly, the main amplifier circuit may be shut down to save power whereafter the feedforward error correction loop is configured as a temporary main amplifier circuit. During low power consumption, for example, the main amplifier is shut off and a feedforward loop is used as a temporary main amplification circuit until a higher level of power is needed. In an alternative embodiment, the feedforward circuit(s) is shut off to reduce power consumption when the main power amplifier provides suitable linearity by itself.

Figure 1:
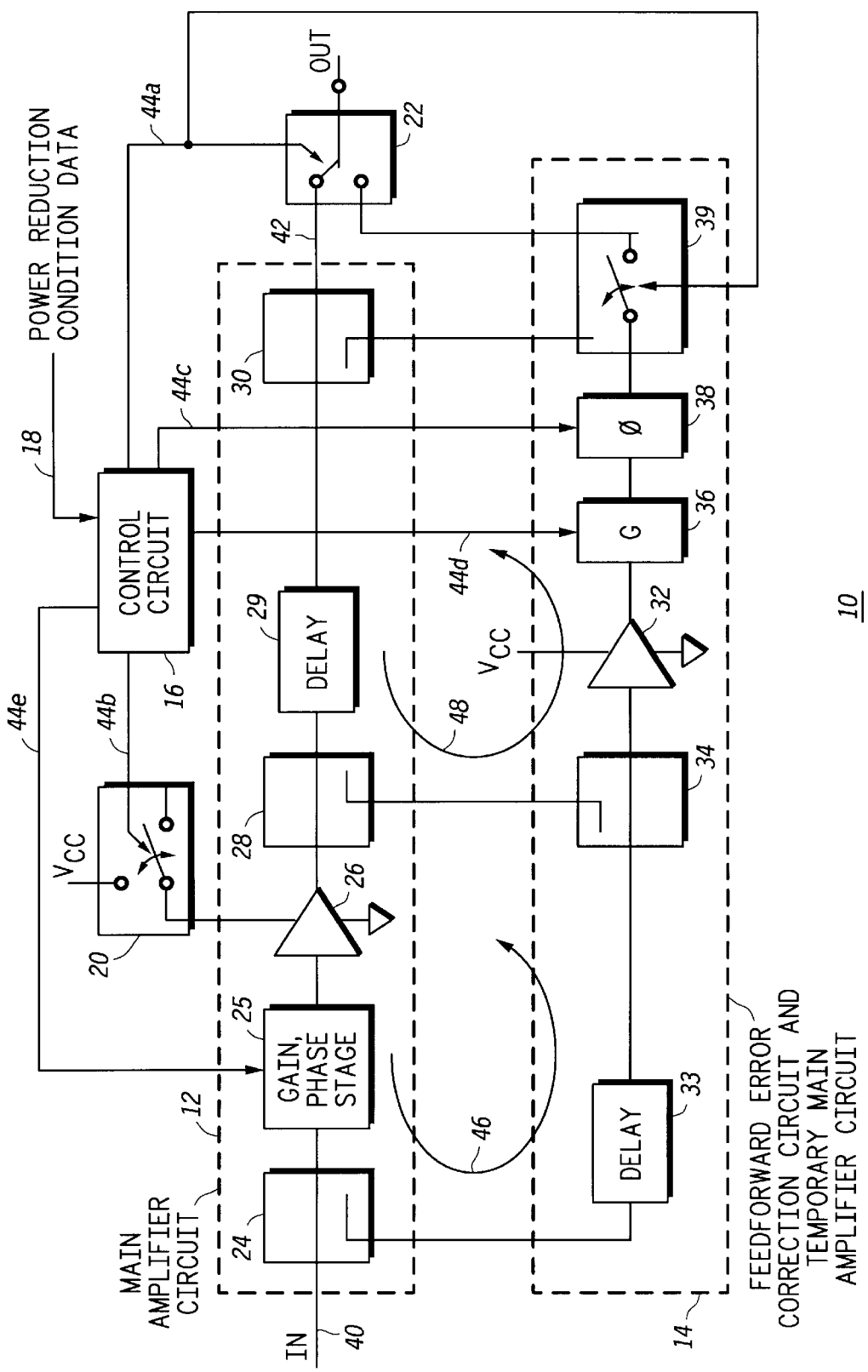
FIG. 1 is a block diagram illustrating one example of a linear power amplifier in accordance with one embodiment of the invention.

FIG. 1 illustrates a relevant portion of a linear power amplifier 10 that includes a main amplifier circuit 12 and an error correction circuit, such as a feedforward error correction circuit 14. Although not shown, the linear power amplifier 10 may be incorporated as part of an extended linear power amplifier system and may further include, for example, splitters and combiners, as known in the art. Linear power amplifier 10 includes a control circuit 16 operatively responsive to power reduction condition data 18 to control switch 20, switch 22, and switch 39 based on the power reduction condition data 18 to shut down the main amplifier circuit 12 and reconfigure the feedforward error correction circuit 14 as a temporary main amplifier circuit.

The main amplifier circuit 12 may include a first coupler 24, a gain and phase adjustment stage 25, a power amplifier 26, a dirty path coupler 28, a delay stage 29 and an error signal cancellation coupler 30. The feedforward error correction circuit 14 may include a feedforward error amplifier 32, a delay stage 33, a carrier cancellation coupler 34, a variable gain (attenuation) stage 36, a variable phase stage 38, and switch 39. The couplers may be adjustable to provide varying levels of coupling coefficients. The main amplifier circuit 12 has an input that receives an input signal 40 and an output 42 that outputs an amplified signal to switch 22. The feedforward error correction circuit 14 provides feedforward error correction as known in the art. The feedforward error amplifier 32 has an input operatively coupled to the carrier cancellation coupler 34, and an output operatively coupled to the switch 39 through the variable gain stage 36 and through the variable phase stage 38. It will be recognized that the variable gain stage 36 and variable phase stage 38 can be located at any suitable point in the feedforward loop. During normal operation, the control circuit 16 suitably adjusts the gain and phase adjustment stage 25, the variable gain stage 36 and the variable phase stage 38 to provide suitable attenuation and phase adjustment to reduce error as known in the art. The delay stages 29 and 33 are used to provide desired delays in signals among the various circuits as known in the art.

A control circuit 16, which may be a microprocessor, digital signal processor, discrete logic, a combination of hardware and software, or any other suitable mechanism, generates various control signals 44a–44e. As shown, a carrier cancellation loop 46 is formed by the main amplifier circuit 12 and the feedforward error correction circuit 14. In addition, an inter modulation loop 48 is also formed by the main amplifier circuit 12 and the feedforward error correction circuit 14.

In response to the power reduction condition data 18, the control circuit 16 removes power from the power amplifier 26 and configures the feedforward error correction circuit 14 as a temporary main amplifier circuit. For example, in operation, the control circuit 16 controls switch 20 through control signal 44b to provide supply voltage VCC to the power amplifier 26, controls switch 22 and switch 39 through control signal 44a to provide an output signal from the error signal cancellation coupler 30. The switches 20, 22 and 39 may be any suitable relay, switching matrices, or any other suitable switching mechanisms. As shown, the feedforward error correction circuit 14 then provides feedforward error correction as known in the art. When a lower power condition is detected for the power amplifier 26, or any other suitable power reduction condition occurs, the control circuit 16 switches switch 20 to remove power from the power amplifier 26 to effectively isolate the main amplifier circuit 12. At the same time, the control circuit controls switch 22 and switch 39 to switch to a position that provides an output from the feedforward error correction circuit 14. In addition, the control circuit 16 adjusts the variable gain stage 36 and the variable phase stage 38 for the signal associated with the error correction circuit to configure the feedforward error correction circuit 14 as a temporary main amplifier circuit. The variable gain stage 36 is controlled through control signal 44d, and the variable phase stage 38 is suitably controlled through control signal 44c to provide the requisite gain and phase compensation as though the feedforward error correction circuit were a main amplifier circuit. In this way, power consumption is reduced, since the main amplifier circuit is effectively disabled, while the feedforward error correction circuit is configured as a temporary main amplifier circuit to provide the suitable linearity required, for example, during low power conditions or other suitable condition. While not shown, any desired delays can also be suitably adjusted to effectively provide the delays required to have the feedforward error correction circuit act as the main amplifier circuit. Through the switch 22 and switch 39, the control circuit 16 bypasses error signal cancellation coupling from the feedforward error correction circuit 14 in response to the power reduction condition data 18.

The power reduction condition data 18 may be from any suitable source, including a power reduction condition detector or may be simply a time of day, a performance metric of the linear power amplifier, for example, a desired linearity level, or a level of error correction provided by the feedforward error correction circuit 14, or any other suitable condition which would warrant the removal of the main amplifier circuit.

In an alternative embodiment, the control circuit 16 may gradually reduce the power to the main amplifier circuit, namely power amplifier 26, on a gradual basis as required, in contrast to a complete removal of the power to the power amplifier 26.

The linear power amplifier 10 may be an amplifier such as a power amplifier described, for example, in U.S. Pat. No. 5,307,022, or any other suitable amplifier. Also as known in the art, an embedded artificial error signal generator, such as a pilot tone generator, or any other suitable artificial error signal generation technique may be used to introduce some form of artificial error signal.

The power amplifier 26 may be, for example, a plurality of cascaded parallel coupled power amplifiers such as those found, for example, in a double density expandable linear power amplifier sold by Motorola Inc., Product No, SGTF 1066A, as may be found, for example, in a Motorola SC™4840 or SC™2440 base stations, or any other suitable power amplifier configuration.

Figure 2:
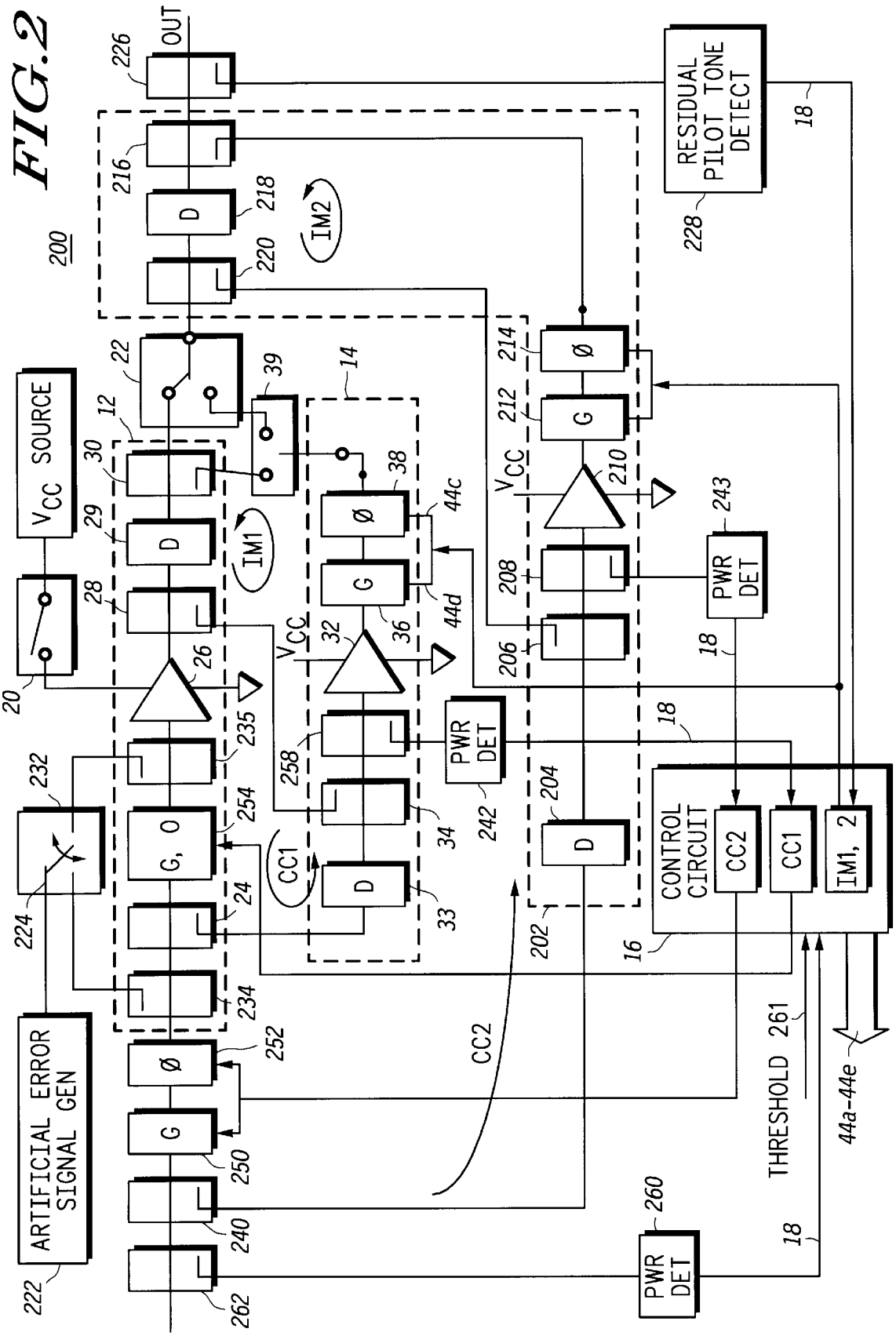
FIG. 2 is block diagram illustrating one example of a linear power amplifier in accordance with one embodiment of the invention that employs dual feedforward error correction circuits.

FIG. 2 illustrates a linear power amplifier 200 that includes the main amplifier circuit 12, a first error correction circuit, such as a feedforward error correction circuit 14, and a second error correction circuit, such as a second feedforward error correction 202. It will also be recognized that additional feedforward error correction circuits may also be used. In normal operation, the error correction circuits provide dual feedforward error correction loops to provide additional error compensation to provide improved linearity for the main amplifier circuit 12. However, in response to power reduction condition data 18, the control circuit 16 removes power from the power amplifier 26 through switch 20 and also adjusts the gain and phase of signals in the remaining paths to configure the first feedforward error correction circuit 14 as a temporary main amplification circuit and also configure the second feedforward error correction circuit 202 as a single loop feedforward error correction circuit for the temporary main amplification circuit.

The second feedforward error correction circuit 202 may include a delay stage 204, a carrier cancellation coupler 206, a power detection coupler 208, a feedforward amplifier 210, adjustable gain and phase stages 212 and 214, error signal cancellation coupler 216, delay stage 218, and dirty path coupler 220. It will be recognized that any of the various stages and circuits may be included as part of any other amplification circuit, or error correction circuit.

An artificial error signal generator 222 provides an artificial error signal 224, such as a pilot signal, which is analyzed and used to remove spurious signal components, known as intermodulation products, caused by the nonlinearity of the transfer characteristics of the amplifiers. The amount of distortion is reduced by adjusting the gain and phase of signals to effectively cancel the distortions in the output signal. Accordingly, the residual pilot tone coupler 226 is used to couple the output signal to determine a residual pilot tone by a residual pilot tone detector 228, as known in the art. The residual pilot tone is used to suitably adjust gain and phase of signals through the intermodulation loops IM1 and IM2.

Hence, during normal operation, the control circuit 16 controls switch 232 to provide the artificial error signal, such as the pilot signal 224, to the main amplifier circuit 12 through the injection pilot tone couplers 234 and 235. This is done through a suitable control signal for the switch 232 (not shown). Also during normal operation, switch 39 is controlled by control circuit 16 to couple the first feedforward error correction circuit 14 to the main amplifier circuit 12 through error signal cancellation coupler 30. Switch 22 is controlled to the state shown to allow coupling of the second feedforward error correction circuit 202 to receive a partially error corrected signal through dirty path coupler 220 and carrier cancellation coupler 206. In addition, the second feedforward error correction circuit 202 receives the input signal 40 via clean path coupler 240. The power detectors 242 and 243 detect the power levels of signals in the first feedforward error correction circuit 14 and in the second feedforward error correction circuit 202. The control circuit 16 suitably controls gain and phase adjustment circuits 250 and 252 based on detected power from power detector 243 in the second feedforward error correction circuit 202. The power detector 242 serves as input to the control circuit 16. The control circuit 16 suitably controls the gain and phase adjustment circuit 254 of the main amplifier circuit 12 to minimize the detected power by power detector 242.

The first feedforward error correction circuit 14 may include a variable delay stage 33 which may be suitably controlled, if desired. The feedforward error correction circuit 14 may also include a power detection coupler 258 to provide a coupled signal for power detector 242.

In this embodiment, power reduction condition detector 260 detects power of the input signal 40 through power detection coupler 262 to determine a power reduction condition. For example, power reduction condition detector 260 generates the power reduction condition data 18 based on the input power level. If low enough, a single feedforward error correction loop may provide suitable linearity and the main power amplifier can be turned off and one of the feedforward error correction circuits can be configured as the main amplifier. The threshold power level may be determined, for example, on an experimental basis, if desired. The controller 16 compares the power reduction condition data 18 to a power level threshold 261 to determine whether reconfiguration should occur. As shown, the controller 16 suitably controls the switches 20, 22, 232, 39 and the gain and phase stages to reconfigure the feedforward error correction circuit as the temporary main amplifier circuit.

Alternatively, power detectors 242, 243 may also be used to determine a power reduction condition where the main amplifier circuit is shut down and the error correction circuit, such as the feedforward error correction circuit 14, is reconfigured as a temporary main amplifier circuit.

The control circuit 16 generates requisite control signals for the switch 20 to open the switch 20 to remove power to the power amplifier 26 in response to the power reduction condition data 18. These control signals are shown as control signals 44 going to, for example, switch 20, switch 232, switch 39, and switch 22. If an artificial error signal 224 is provided to the main amplifier circuit 12 during normal operation, the control circuit 16 effectively reroutes the artificial error signal 224 from the main amplifier circuit 12 to the feedforward error correction circuit 14 through injection pilot tone coupler 234 by controlling switch 232 to provide the artificial error signal 224 to the injection pilot tone coupler 234. The operation of the second feedforward error correction circuit 202 then serves as a single feedforward error correction loop. The control circuit 16 then operatively controls the variable gain stage 36 and variable phase stage 38 (or gain and phase circuits 250 and 252), as well as the variable gain and phase stages 212 and 214 to provide the requisite adjustment to minimize error caused by, for example, by nonlinearities of the feedforward error amplifier 32 in response to detection of residual artificial error signals, as known in the art. The control circuit 16 therefore adjusts the gain and phase of the signal of the second error correction circuit 202 to provide feedforward error correction for the temporary main amplifier circuit, namely the first feedforward error correction circuit 14.

The couplers described herein may be any suitable couplers, as known in the art. For example, depending upon the design of the linear amplifier, the dirty path couplers 28 and 220 may be 30 dB couplers, the error signal cancellation couplers 30 and 216 may be, for example 10 dB couplers, the carrier cancellation couplers 34 and 206 may be 20 dB couplers, and the clean path couplers 24 and 240 may be 10 dB couplers. Injection pilot tone couplers 234,235 may be 10 dB couplers, and coupler 262 may be a 10 dB coupler, if desired. Residual pilot tone detection coupler 226 may be a 30 dB coupler. However, it will be recognized that any suitable couplers may be used.

It will be recognized that the power amplifier 26 may represent cascaded amplifiers and may include, for example, preamplifiers, which may also have power removed therefrom in response to a power reduction condition. In addition, the threshold at which the main power amplifier may be shut off to reconfigure from a dual loop operation to a single loop operation may be the operating level T1 wherein the feedforward error amplifier is capable of the same intermodulation performance as the main power amplifier cascaded with the first loop of error correction operating at rated power T0.

In addition, it may be desirable to design the first feedforward error correction circuit in a way to match the performance of the main amplifier circuit cascaded with one correction loop at the highest possible operating power level. This will allow the feedforward amplifier circuit to reconfigure from dual loop to single loop operation at the highest possible operating power level. The power reduction condition data 18 may be based on the projected intermodulation performance of the first error amplifier determined via the power reduction condition detector 260 and the knowledge of how the first error amplifier's intermodulation performance responds at different operating power levels.

A power reduction condition may also be determined, for example, by providing a power reduction condition detector circuit, such as a power level detector to the power amplifier 26 to determine a level of power consumption of the power amplifier 26. The power reduction condition detector circuit may sense current draw and then send a command to the control circuit 16 to remove power when the current draws below a predetermined threshold.

Alternatively, a power reduction condition, for the main amplifier circuit 12, may also be based on a performance metric of the linear power amplifier 200. For example, if the control of the first feedforward error correction circuit is based on measurements of the actual intermodulation distortion instead of on an artificial pilot tone, then the controller detects if the feedforward amplifier is meeting its performance target with only one loop of feedforward correction via direct measurement of the intermodulation distortion. When one loop no longer meets the performance criteria, the second loop is activated. The addition of circuitry to directly measure the feedforward amplifier's actual intermodulation distortion is optional, but may lead to more optimal reconfiguration thresholds.

In addition, other power reduction conditions may also be used, such as a time of day such that the control circuit 16 removes or otherwise reduces the power to the power amplifier 26 and performs the associated switching of the artificial error signal 224 and switch 232, switch 20, switch 22 and switch 39 based on the time of day. For example, hours such as 1:00 a.m. to 4:00 a.m. in the morning may typically have low usage from a cellular receiver standpoint and as such, power savings can result by using the feedforward error correction circuit 14 as a temporary main amplifier and the second feedforward error correction circuit 202 as single feedforward loop during those times of the day when lower air traffic is anticipated.

Although the embodiment of FIG. 2 illustrates the removal of power from the power amplifier 26, the control circuit 16 may reduce power consumption of the main amplifier on a gradual basis, if desired. For example, if the main amplifier circuit includes several power stages operating in parallel, each parallel stage can be turned off one at a time. When doing this, signal combining networks can also be switched out to reduce loss. Then, if the system is operating at a reduced power level (relative to the maximum rated power of the feedforward amplifier) that is greater than the threshold to reconfigure from two loops to one loop, the intermediate action of turning off one or more stages in the main amplifier can be taken, while still using two loops of feedforward error correction. This will result in reduced current draw (or power savings) as well. The criteria for doing this are the same as described previously.

Alternatively, instead of switching the signal combining networks in or out of the main amplifier circuit when turning individual stages on or off, other combiners may be used such as a type described for example in U.S. Pat. No. 5,543,751, owned by instant assignee, wherein the combiner has minimal insertion loss even when one or more of several amplifier stages is absent (or turned off).

For example, assuming that the main amplifier circuit uses four amplifier devices operating in parallel, and a two loop feedforward system, thresholds T0>T1>T2>T3>T4>T5>T6 may be used where T0=the maximum rated power of the feedforward amplifier, T1 is the level where one of the four main amplifier devices is no longer needed and can be turned off, T2 is the threshold where the second of the four main amplifier devices can be turned off, T3=turn off third, and T4 turns off the entire main amplifier circuits and reconfigures the first feed forward error correction circuit as a temporary main amplifier. This can be extended further if the first feedforward error correction circuit contains two feedforward amplifier devices in parallel. One device can be turned off at T5, and at T6 no feedforward correction is needed so either the second device of the first feedforward error correction circuit can be turned off, and the second feed forward error correction circuit can be reconfigured as the temporary main amplifier, or alternatively the second loop of feedforward correction can be turned off and the first feedforward error correction circuit, which is acting as the temporary main amplifier, can be left to operate in an uncorrected mode. As long as the thresholds are chosen such that the mode of operation meets the performance criteria of the entire feedforward amplifier, all of these modes of operation are possible.

Figure 3:
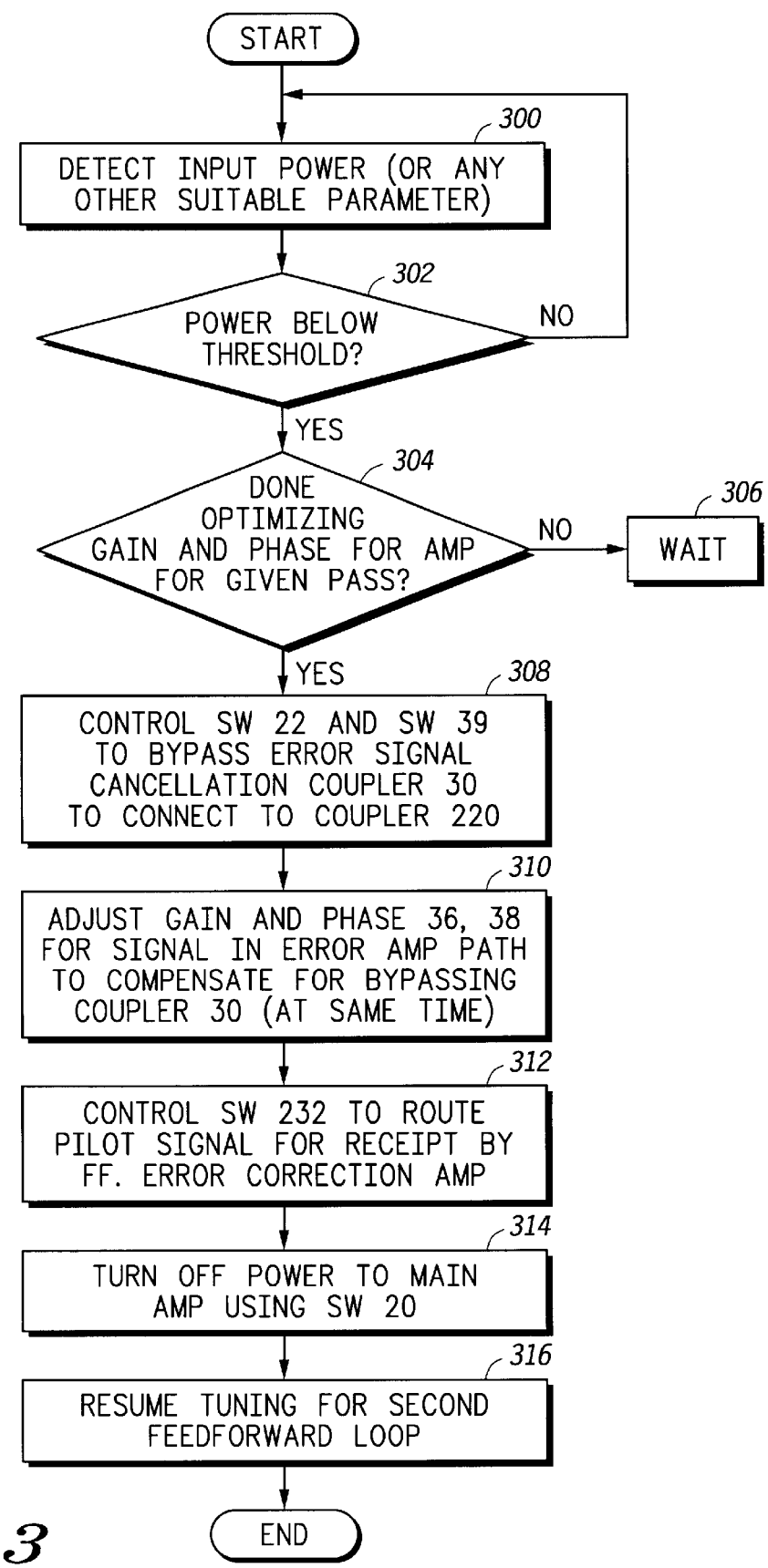
FIG. 3 is a flow chart illustrating one example of the operation of the circuit of FIG. 2.

FIG. 3 illustrates one example of the operation of the linear power amplifier 200 shown in FIG. 2. As shown in block 300, the method includes detecting an input power level, such as through power reduction condition detector 260, to determine a power reduction condition. In this example, as shown in block 302, the power reduction condition is determined based on whether the input signal 40 is below a predetermined threshold. If the detected input power is below a predetermined threshold, the process continues as shown in block 304, where the process includes determining whether optimizing of the gain and phase and/or delay for a given amplifier, such as power amplifier 26, feedforward error amplifier 32 or feedforward amplifier 210 has been completed for a given pass of input signal. This is done, for example, to insure that the gain and phase stages are stabilized before switching or reconfiguring a feedforward error correction circuit to become the temporary main amplifier circuit. If, for example, the control circuit 16 has not completed optimizing the gain and phase of the various adjustable gain and phase stages in each of the paths, the control circuit 16 waits until optimizing is complete, as shown in block 306. As shown in block 308, once gain and phase optimization has been completed, the process includes bypassing error signal cancellation coupling in response to the power reduction condition, as shown in block 308. For example, switch 22 and switch 39 are switched to bypass error signal cancellation coupler 30 so that the output from the feedforward error correction circuit 14 is coupled through dirty path coupler 220. As shown in block 310, the process includes adjusting the gain and phase, such as through variable gain stage 36 and variable phase stage 38, for the signal in the feedforward error correction circuit path to compensate for bypassing the error signal cancellation coupler 30. Preferably, this is done at the same time the bypassing of error signal cancellation coupler 30 is performed.

As shown in block 312, the process includes re-routing the artificial error signal from the main amplifier circuit to the first error correction circuit in response to the power reduction condition. This may be accomplished, for example, by controlling switch 232 to route the artificial error signal to be received by feedforward error amplifier 32 through coupler 234 by controlling switch 232. Once the switch 232 switches the artificial error signal to the feedforward error correction circuit 14, which is now reconfigured as a temporary main amplifier, the power to the power amplifier 26 is turned off by opening switch 20, as shown in block 314. The process then includes resuming tuning for the second feedforward error correction circuit 202 by suitably adjusting the gain and phase stages 212 and 214 and any delay as required so that the second feedforward error correction circuit 202 serves as a single feedforward error correction loop for the temporary main amplifier circuit. This is shown in block 316. The process then continues to effectively reverse the reconfiguration when a higher power level is required. Accordingly, the switches 20,22, 39 and 232 are suitably adjusted to reconfigure the linear power amplifier 200 back to a normal operating state that includes the main amplifier circuit in normal operation along with two feedforward loops provided by the first and second feedforward error correction circuits 14 and 202.

Figure 4:
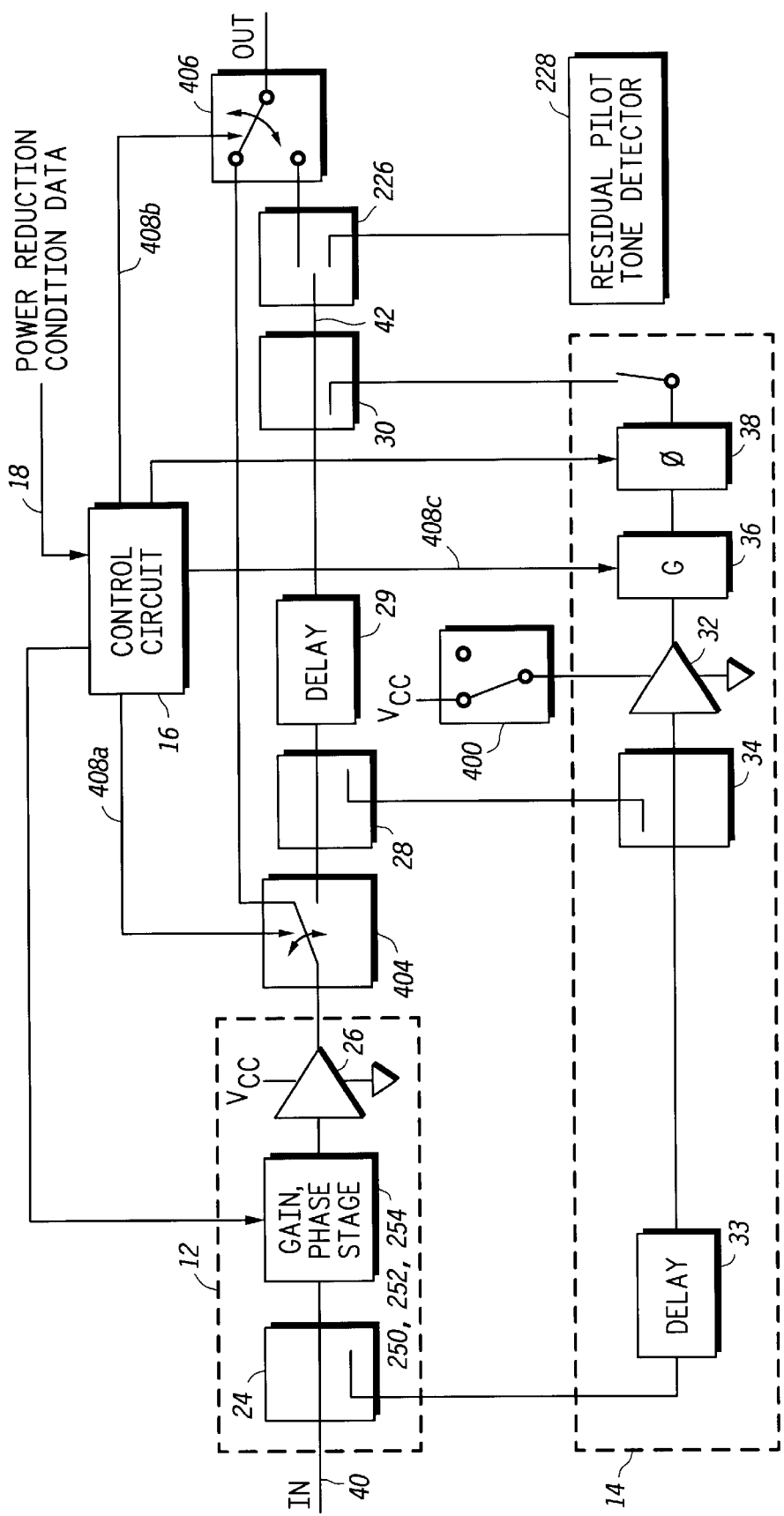
FIG. 4 is a block diagram illustrating one example of a linear power amplifier in accordance with another embodiment of the invention.

FIG. 4 illustrates a block diagram showing an alternative embodiment that allows removal (or gradual reduction) of power to the feedforward error correction circuit 14 instead of removing power from the main amplifier circuit 12. In this embodiment, additional power savings may be provided by selectively shutting down the feedforward error correction circuit individually, when desired. In this embodiment, power source switch 400 is provided so that power may be removed from feedforward amplifiers within the feedforward error correction circuit 14. In addition, switches 404 and 406 can be used to bypass the losses associated with coupler 28, delay stage 29, coupler 30 and residual pilot tone detection coupler 226 when the first feedforward error correction circuit 14 is shut down via switch 400. The switches 400, 404 and 406 may be suitably controlled by the control circuit 16 through control signals 408a–408c. Suitable adjustments are made to stages 250, 252 and 254 so that the input signal to output with have the same characteristics before and after the feedforward error correction loop is shut off. Because each of the stages of a feedforward error correction circuit may be designed for a particular feedforward architecture or application, any particular design may be better suited for removal of a loop of feedforward correction instead of reconfiguring an error path as a temporary main amplifier and removing the main amplifier from the amplification path.

Additionally, in a two loop feedforward amplifier, it may be desirable to implement both options, one in each loop. For instance, it may be desirable to reconfigure the first error path as a temporary main path and remove the main path from the amplification path when operating below a threshold T1<T0, where T0 is the maximum rated power. Further, when operating at a second threshold T2<T1, it may be more optimal to turn off the second feedforward correction loop (operating as the first or only feedforward correction loop cascaded after the temporary main amplifier which is the first error correcting amplifier) instead of converting it to the temporary main amplifier directly.

Accordingly, the above-described linear amplifier and methods enhance efficiency in linear amplifiers. In addition, where additional sleep mode operation is employed, the above-described linear amplifier operation may provide additional power reduction efficiency. In addition, the feedforward amplifier circuits preferably offer approximately 60 DBC of linearity performance over the desired frequency range. However, it will be recognized that any suitable feedforward amplifier circuits may also be used.

It should be understood that the implementation of other variations and modifications of the invention in its various aspects will be apparent to those of ordinary skill in the art, and that the invention is not limited by the specific embodiments described. It is therefore contemplated to cover by the present invention, any and all modifications, variations, or equivalents that fall within the spirit and scope of the basic underlying principles disclosed and claimed herein.

What is claimed is:

1. A linear power amplifier comprising:
   at least one main amplifier circuit having a first input and a first output and at least one power amplifier;
   at least a first error correction circuit operatively coupled to the main amplifier circuit to provide feedforward error correction, wherein the at least first error correction circuit includes at least a first feedforward error amplifier having a second input and a second output;
   a control circuit, operatively coupled to remove power from at least one of: the at least one power amplifier and the at least first feedforward error amplifier, in response to a power reduction condition; and
   a first switch operatively controllable by the control circuit wherein the control circuit removes power from the at least one power amplifier through the first switch and also adjusts at least a gain and a phase of a signal associated with the at least first error correction circuit to configure the at least first error correction circuit as a temporary main amplifier circuit in response to the power reduction condition.

2. The linear power amplifier of claim 1 comprising at least a second error correction circuit operatively coupled to the at least first error correction circuit to provide feedforward error correction, wherein the at least second error correction circuit includes at least a second feedforward error amplifier having a third input and a third output.

3. The linear power amplifier of claim 1 including an artificial error signal generator operatively coupled to provide an artificial error signal for the at least one main amplifier circuit and wherein the control circuit re-routes the artificial error signal from the main amplifier circuit to the at least first error correction circuit in response to the power reduction condition.

4. The linear power amplifier of claim 1 including a second switch operatively coupled to the first output of the main amplifier circuit and to the second output of the first feedforward error amplifier and wherein the control circuit controls the second switch to bypass error signal cancellation coupling by the first error correction circuit in response to the power reduction condition.

5. The linear power amplifier of claim 1 wherein the control circuit is operatively coupled to at least a second error correction circuit that is operatively coupled to the first error correction circuit, and adjusts at least a gain and a phase of a signal associated with the at least second error correction circuit to provide feedforward error correction for the temporary main amplifier circuit.

6. The linear power amplifier of claim 1 including a power reduction condition detector operatively coupled to the control circuit and operatively coupled to detect power consumption of at least one power amplifier.

7. The linear power amplifier of claim 1 wherein the power reduction condition is based on at least a level of error correction provided by the at least first error correction circuit.

8. A linear power amplifier comprising:
   at least one main amplifier circuit having a first input and a first output and at least one power amplifier;
   at least a first error correction circuit operatively coupled to the main amplifier circuit to provide feedforward error correction, wherein the at least one error correction circuit includes at least a first error correction amplifier having a second input and a second output; and
   a control circuit, operatively coupled to reduce power consumption of the main amplifier and operatively coupled to configure the at least one error correction circuit to a temporary main amplifier circuit in response to a power reduction condition.

9. The linear power amplifier of claim 8 including a first switch operatively controllable by the control circuit wherein the control circuit removes power from the at least one power amplifier through the first switch and also adjusts at least a gain and a phase of a signal associated with the at least first error correction circuit to configure the at least first error correction circuit as a temporary main amplifier circuit in response to the power reduction condition.

10. The linear power amplifier of claim 8 wherein the control circuit is operatively coupled to remove power from the at least first error correction circuit in response to the power reduction condition.

11. The linear power amplifier of claim 8 comprising at least a second error correction circuit operatively coupled to the at least first error correction circuit to provide feedforward error correction, wherein the at least second error correction circuit includes at least a second feedforward error amplifier having a third input and a third output.

12. The linear power amplifier of claim 11 wherein the main amplifier circuit includes a plurality of parallel coupled power amplifiers.

13. The linear power amplifier of claim 11 including an artificial error signal generator operatively coupled to provide an artificial error signal for the at least one main amplifier circuit and wherein the control circuit re-routes the artificial error signal from the main amplifier circuit to the at least first error correction circuit in response to the power reduction condition.

14. The linear power amplifier of claim 11 including a second switch operatively coupled to the first output of the main amplifier circuit and to the second output of the feedforward error amplifier and wherein the control circuit controls the second switch to bypass error signal cancellation coupling by the first error correction circuit in response to the power reduction condition.

15. The linear power amplifier of claim 9 wherein the control circuit is operatively coupled to at least a second error correction circuit that is operatively coupled to the first error correction circuit and adjusts at least a gain and a phase of a signal associated with the at least second error correction circuit to provide feedforward error correction for the temporary main amplifier circuit.

16. The linear power amplifier of claim 11 including a power reduction condition detector operatively coupled to the control circuit and operatively coupled to detect power consumption of at least one power amplifier.

17. The linear power amplifier of claim 16 wherein the power reduction condition is based on at least one performance metric of the linear power amplifier.

18. The linear power amplifier of claim 16 wherein the power reduction condition is based on at least a time of day.

19. The linear power amplifier of claim 16 wherein the power reduction condition is based on at least a level of error correction provided by the at least first error correction circuit.

20. The linear power amplifier of claim 8 wherein control circuit reduces power consumption of the at least one power amplifier on a gradual basis in response to the power reduction condition.

21. The linear power amplifier of claim 8 wherein the control circuit reduces power consumption of the main amplifier circuit by removing power to the at least one power amplifier.

22. A method for providing linear power amplification comprising:

reducing power to a power amplifier in a main amplifier circuit in response to determining a power reduction condition for the power amplifier; and configuring at least a first error correction amplifier associated with at least a first feedforward error correction circuit as a temporary main amplifier circuit in response to the power reduction condition.

23. The method of claim 22 including the step of removing power from the power amplifier and adjusting at least a gain and a phase of a signal associated with the at least first feedforward error correction circuit to configure the at least first ff error correction circuit as a temporary main amplifier circuit in response to the power reduction condition.

24. The method of claim 22 including the step of removing power from the at least first error correction amplifier in response to the power reduction condition.

25. The method of claim 22 including the steps of providing an artificial error signal for the power amplifier and re-routing the artificial error signal from the power amplifier to the at least first error correction amplifier in response to the power reduction condition.

26. The method of claim 22 including the step of bypassing error signal cancellation coupling by the at least first error correction amplifier in response to the power reduction condition.

27. The method of claim 23 including the step of adjusting at least a gain and a phase of a signal associated with a second error correction circuit to provide feedforward error correction for the temporary main amplifier circuit.

28. The method of claim 22 including the step of detecting power consumption of the power amplifier to determine a power reduction condition.

29. The method of claim 22 including the step of determining the power reduction condition based on at least one performance metric of the linear power amplifier.

30. The method of claim 22 including the step of determining the power reduction condition based on at least a level of error correction provided by the at least first error correction amplifier.

* * * * *